US006942733B2

(12) United States Patent
Cherko et al.

(10) Patent No.: US 6,942,733 B2
(45) Date of Patent: Sep. 13, 2005

(54) FLUID SEALING SYSTEM FOR A CRYSTAL PULLER

(75) Inventors: Carl F. Cherko, St. Charles, MO (US); Robert D. Cook, O'Fallon, MO (US)

(73) Assignee: MEMC Electronics Materials, Inc., St. Peters, MO (US)

( * ) Notice: Subject to any disclaimer, the term of this patent is extended or adjusted under 35 U.S.C. 154(b) by 272 days.

(21) Appl. No.: 10/465,528

(22) Filed: Jun. 19, 2003

(65) Prior Publication Data

US 2004/0255847 A1 Dec. 23, 2004

(51) Int. Cl.[7] .............................................. C30B 15/20
(52) U.S. Cl. ......................... 117/208; 117/14; 117/15; 117/215; 117/217
(58) Field of Search ............................. 117/14, 15, 34, 117/208, 215, 217

(56) References Cited

U.S. PATENT DOCUMENTS

| | | | |
|---|---|---|---|
| 3,659,453 A | * | 5/1972 | Martin, Jr. ..................... 73/40 |
| 4,164,609 A | | 8/1979 | Jensen |
| 4,172,469 A | | 10/1979 | Boehringer |
| 4,172,470 A | | 10/1979 | Walker |
| 4,239,240 A | | 12/1980 | Wilkinson |
| 4,427,204 A | | 1/1984 | Alley |
| 4,738,282 A | | 4/1988 | Boehringer |
| 5,316,742 A | | 5/1994 | Tomioka et al. |
| 5,441,014 A | | 8/1995 | Tomioka et al. |
| 5,567,399 A | | 10/1996 | Von Ammon et al. |
| 6,135,458 A | | 10/2000 | Fuse |
| 6,240,981 B1 | * | 6/2001 | Nickens et al. ............... 141/51 |
| 6,579,362 B2 | | 6/2003 | Ferry et al. |
| 6,733,585 B2 | * | 5/2004 | Inagaki et al. ................ 117/13 |
| 6,754,547 B1 | * | 6/2004 | Mitani ........................ 700/94 |
| 6,858,076 B1 | * | 2/2005 | Nakajima et al. ............. 117/13 |
| 2002/0144648 A1 | * | 10/2002 | Tu et al. ..................... 117/208 |
| 2003/0015840 A1 | * | 1/2003 | Davis ......................... 277/320 |
| 2003/0183163 A1 | * | 10/2003 | Kubo et al. .................. 117/213 |

FOREIGN PATENT DOCUMENTS

JP          63-256593          10/1988

* cited by examiner

*Primary Examiner*—Robert Kunemund
(74) *Attorney, Agent, or Firm*—Senniger Powers (57) ABSTRACT

A fluid sealing system is provided for use in a crystal puller for growing a monocrystalline ingot. The crystal puller has a housing, a fluid flow path contained in the housing, and a fluid passage through a wall of the housing for passage of fluid. The fluid sealing system includes a fluid connector head adapted for connection to the fluid passage and to the fluid flow path to establish fluid communication between the fluid flow path and the outside of the housing. The head has a port adapted for fluid communication with the fluid passage through the wall of the housing. First and second seals around the port are adapted for sealing engagement with the head. A space is defined generally between the first and second seals, and a leak detector is arranged to monitor the space for detecting fluid leakage past at least one of the seals.

23 Claims, 5 Drawing Sheets

FLUID SEALING SYSTEM FOR A CRYSTAL PULLER

BACKGROUND OF THE INVENTION

The present invention relates generally to crystal pullers for growing single crystal semiconductor material, and to fluid sealing systems for use in such crystal pullers.

Single crystal semiconductor material, which is the starting material for fabricating many electronic components, is commonly prepared using the Czochralski ("Cz") method. In this method, polycrystalline semiconductor source material such as polycrystalline silicon ("polysilicon") is melted in a crucible. Then a seed crystal is lowered into the molten material (often referred to as the melt) and slowly raised to grow a single crystal ingot. As the ingot is grown, an upper end cone is formed by decreasing the pull rate and/or the melt temperature, thereby enlarging the ingot diameter, until a target diameter is reached. Once the target diameter is reached, the cylindrical main body of the ingot is formed by controlling the pull rate and the melt temperature to compensate for the decreasing melt level. Near the end of the growth process but before the crucible becomes empty, the ingot diameter is reduced to form a lower end cone which is separated from the melt to produce a finished ingot of semiconductor material.

To increase throughput of the crystal puller, it is desirable to increase the pull rate "v" at which the crystal is pulled up from the melt and the axial temperature gradient at the solid-liquid interface. Co-assigned U.S. Pat. No. 6,579,362, issued Jun. 17, 2003, and incorporated herein by reference, discloses a heat shield assembly for increasing the pull rate and the axial temperature gradient at the solid-liquid interface. This heat shield assembly includes a cooling shield or heat exchanger including a fluid flow path for carrying cooling water therethrough. It is critical that the cooling water not leak into the crystal puller because water will affect the pressure within the puller and thereby damage the ingot and, if the water leak is severe, damage the crystal puller. Moreover, the pressure maintained within the puller (typically, vacuum pressure) must not be negatively affected by the heat exchanger.

SUMMARY OF THE INVENTION

Among the several objects of the present invention may be noted the provision of a fluid sealing system for inhibiting fluid leakage into a crystal puller; and the provision of such a system that enables detection of fluid leakage from a fluid flow path.

Briefly, apparatus of this invention is a fluid sealing system for use in a crystal puller for growing a monocrystalline ingot from molten semiconductor source material. The crystal puller has a housing enclosing a crystal growth chamber, a crucible contained in the growth chamber for holding the molten semiconductor source material, a heater in thermal communication with the crucible for heating the crucible, a pulling mechanism for pulling the ingot from the molten source material held by the crucible, a fluid flow path contained in the housing, and a fluid passage through a wall of the housing for passage of fluid between outside the housing and the fluid flow path. The fluid sealing system comprises a fluid connector head adapted for connection to the fluid passage and to the fluid flow path to establish fluid communication between the fluid flow path and the outside of the housing. The head has a port adapted for fluid communication with the fluid passage through the wall of the housing. First and second seals around the port are adapted for sealing engagement with the head. A space is defined generally between the first and second seals, and a leak detector is arranged to monitor the space for detecting fluid leakage past at least one of the first and second seals.

In another aspect, the invention is directed to a crystal puller for growing a monocrystalline ingot from molten semiconductor source material. The crystal puller comprises, in addition to the features substantially described above, a heat exchanger disposed above the molten source material and interposed between the ingot and the crucible as the ingot is pulled from the molten source material. The heat exchanger is exposed to heat radiated from the ingot for increasing the rate at which the ingot is cooled and thereby increasing an axial temperature gradient of the ingot as the ingot is pulled from the molten source material. The heat exchanger also includes the fluid flow path. The puller further comprises a fluid passage through the wall of the housing for passage of fluid between outside the housing and the fluid flow path, and the sealing system is adapted for inhibiting fluid leakage from the fluid flow path and for inhibiting fluid leakage into the housing.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
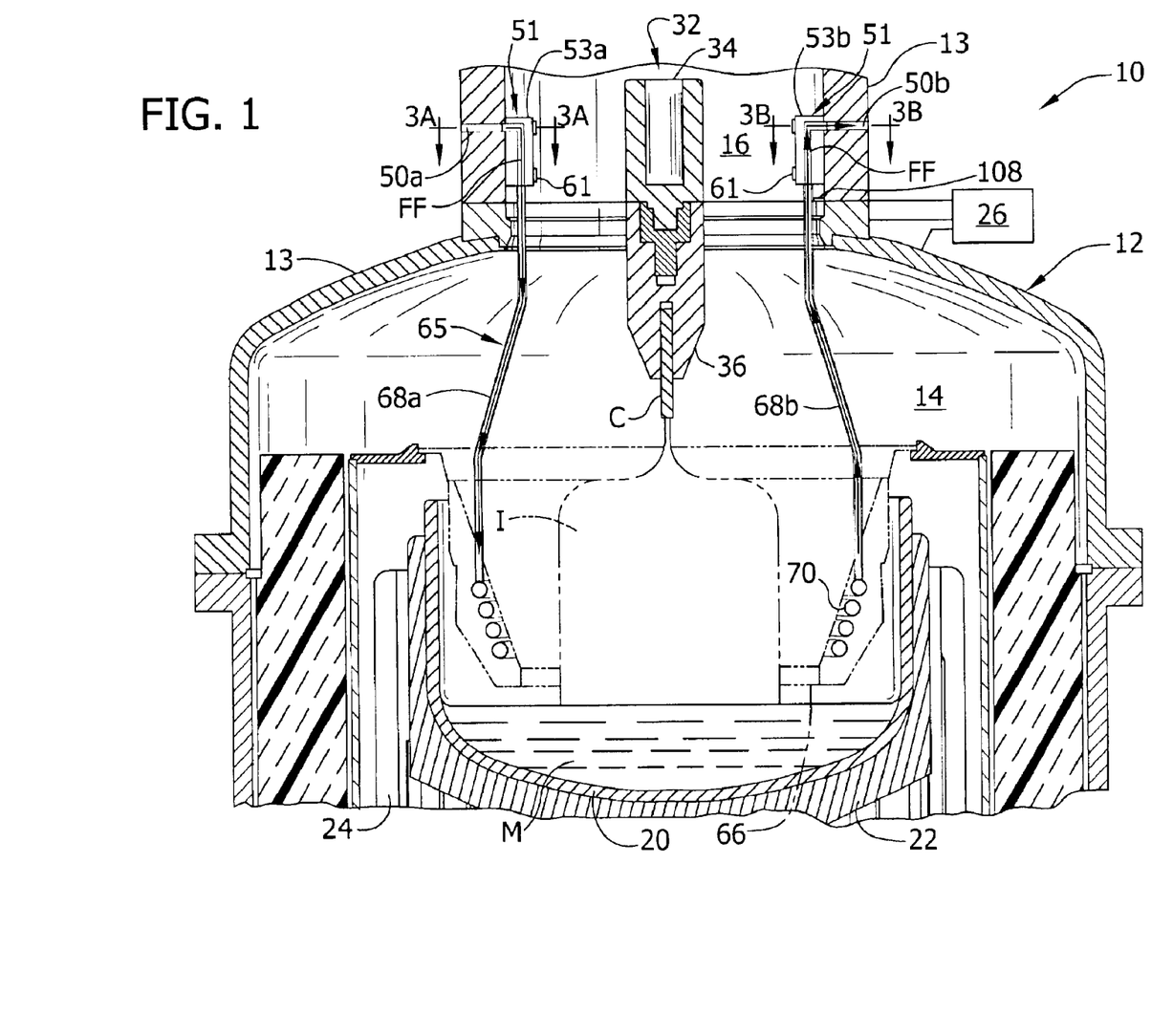
FIG. 1 is a fragmentary, partially schematic, vertical cross-section of a crystal puller incorporating a heat exchanger and fluid sealing system of the present invention.

Referring now to the drawings and in particular to FIG. 1, a crystal puller of an embodiment of the present invention is generally designated in its entirety by the reference numeral 10. The puller of this embodiment is of the type used to grow monocrystalline silicon ingots (e.g., ingot I shown in phantom in FIG. 1) according to the Czochralski method. The crystal puller 10 includes a water cooled housing, generally indicated at 12, including walls 13 for isolating an interior which includes a lower crystal growth chamber 14 and an upper pull chamber 16 having a significantly smaller transverse dimension than the growth chamber. A pump (not shown) or other suitable means may be provided for drawing a vacuum in the interior of the housing 12. A quartz crucible 20 is supported by a susceptor 22 in the chamber and contains molten semiconductor source material M from which the monocrystalline silicon ingot I is grown. A heater 24 is in thermal communication with the crucible 20 for heating the crucible to a temperature sufficient to melt the source material M in the crucible. The heater 24 may be controlled by an external controller 26 (shown schematically) so that the temperature of the molten source material M is precisely controlled throughout the pulling process.

A pulling mechanism 32 includes a pull shaft 34 extending down from a mechanism (not shown) capable of raising, lowering and rotating the pull shaft. The crystal puller 10 may have a pull wire (not shown) rather than a shaft, depending upon the type of puller. The pull shaft terminates in a seed crystal chuck 36 which holds a seed crystal C used to grow the monocrystalline ingot I. In growing the ingot I, the pulling mechanism 32 lowers the seed crystal C until it contacts the surface of the molten source material M. Once the seed crystal C begins to melt, the pulling mechanism 32 slowly raises the seed crystal up through the growth chamber 14 and pull chamber 16 to grow the monocrystalline ingot I. The speed at which the pulling mechanism 32 rotates the seed crystal C and the speed at which the pulling mechanism raises the seed crystal (i.e., the pull rate v) are typically controlled by the controller 26. The general construction and operation of the crystal puller 10, except to the extent explained more fully below, is conventional and known by those of ordinary skill in the art. Other types of crystal pullers may be used within the scope of this invention.

Referring to FIGS. 1–2 and 3A–3B, an entry fluid passage 50a extends through the wall 13 of the housing 12 generally in the pull chamber 16. Note that the location of the fluid passage 50a is not critical, e.g., the passage may be located in the growth chamber 14. An exit fluid passage 50b is disposed opposite the entry fluid passage 50a and also extends through the wall 13 of the housing 12.

Figure 2:
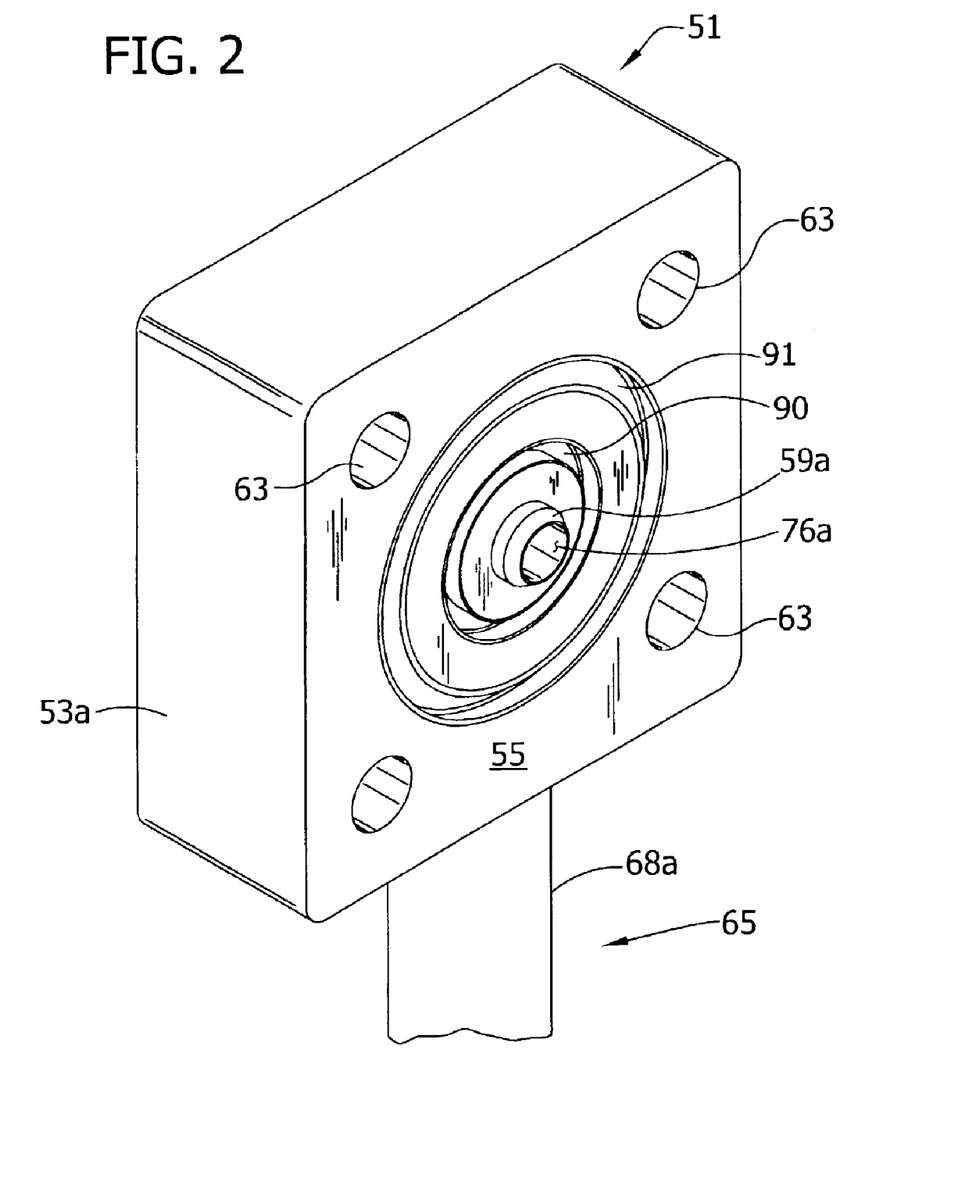
FIG. 2 is a perspective of a fluid connector head of the heat exchanger with seals of the sealing system omitted for clarity.
Figure 3A:
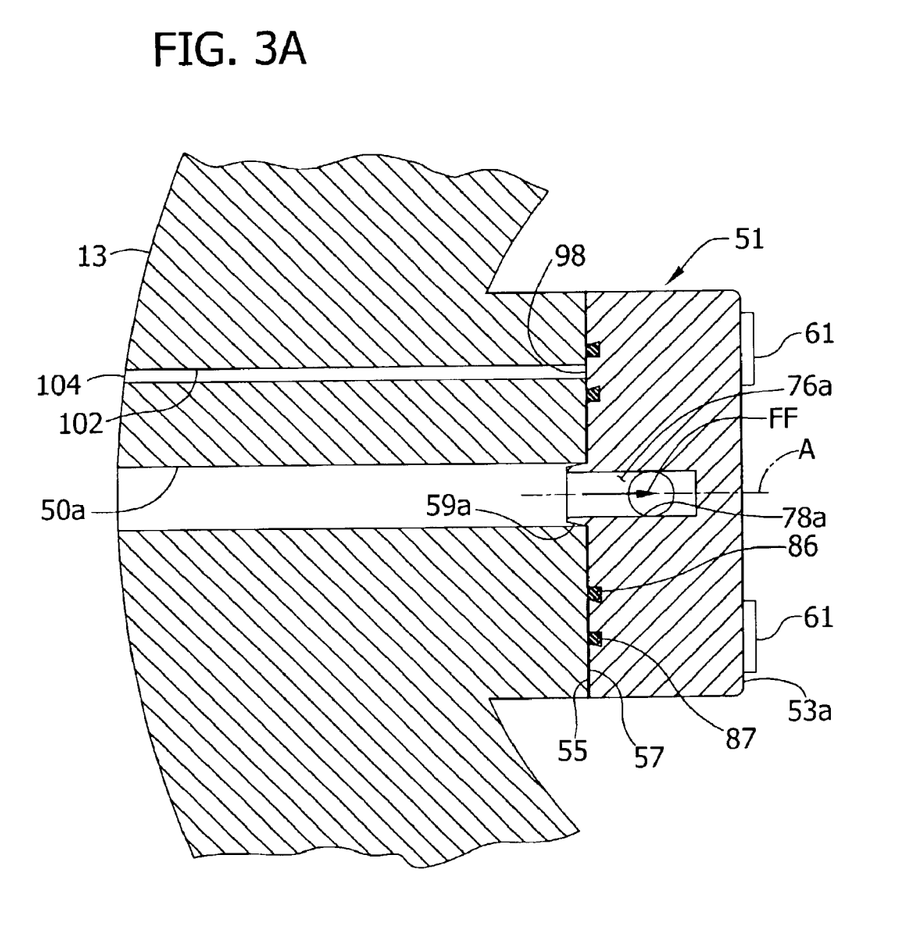
FIG. 3A is a horizontal cross-section taken along line 3A—3A of FIG. 1
Figure 3B:
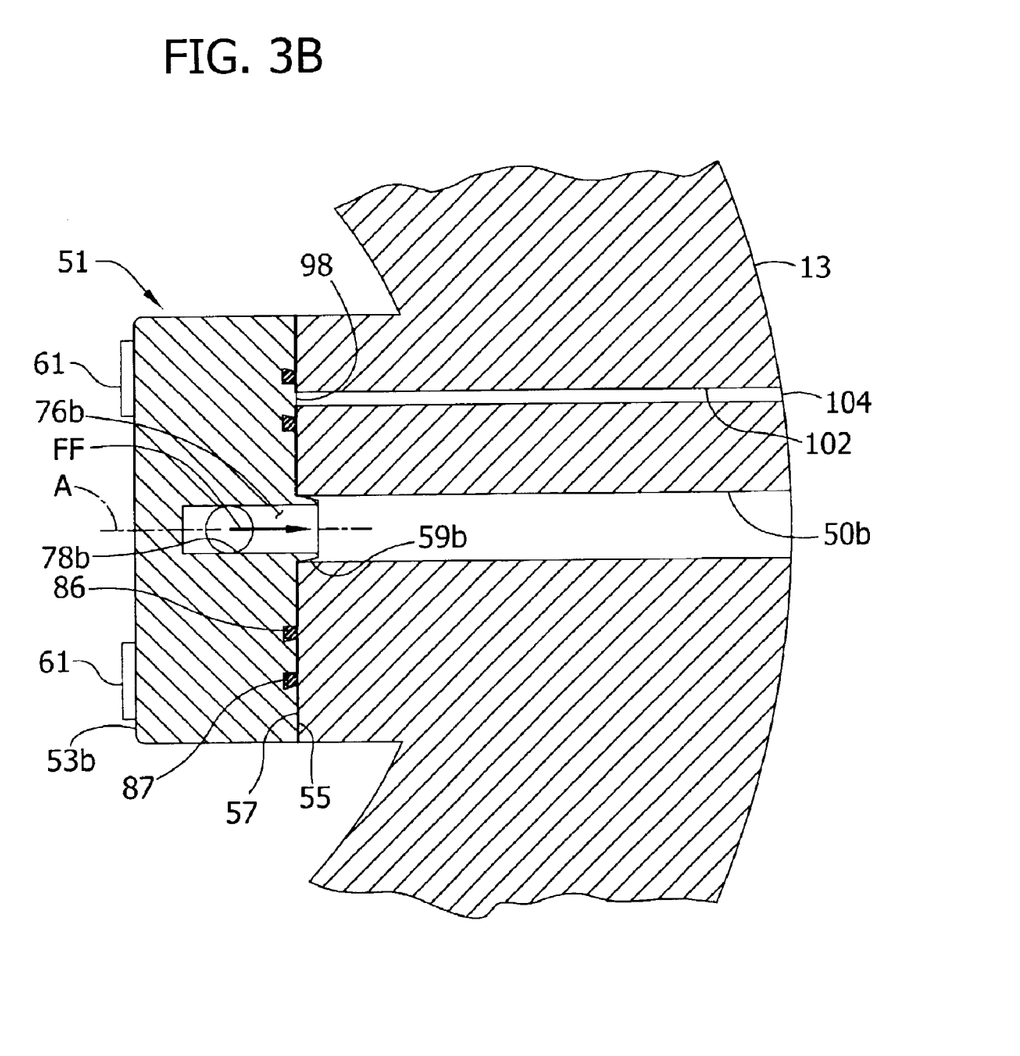
FIG. 3B is a horizontal cross-section taken along line 3B—3B of FIG. 1.

Sealing systems of this embodiment are generally designated 51 and generally comprise inlet and outlet fluid connector heads 53a, 53b, each of which includes a mounting face 55 adapted to engage a mounting portion 57 of the wall 13 of the housing 12 adjacent one of the fluid passages 50a, 50b. A centrally located tubular stud 59a, 59b extends outwardly from each fluid connector head 53a, 53b and is sized for reception in the respective fluid passage. As shown in FIGS. 2 and 3A–3B, each stud 59a, 59b is tapered to facilitate reception of the stud in the respective fluid passage 50a, 50b. Upon reception of the stud in the respective fluid passage, the fluid connector heads 53a, 53b are attached to the mounting portion 57 of the wall 13 by fasteners 61 (e.g., four bolts) extending through fastener holes 63 in each block and through threaded holes (not shown) in the portion.

The sealing systems are used to inhibit leakage from the fluid passages 50a, 50b and a fluid flow path, indicated by lines FF (FIG. 1). The fluid flow path FF of this embodiment is provided for the flow of cooling fluid (e.g., water) to cool the growing ingot. The fluid flow path FF extends through a heat exchanger, generally designated 65, contained in the housing 12. The heat exchanger 65 is disposed above the source material M and at least a portion of the exchanger is interposed between the ingot I and the crucible 20 as the ingot is pulled from the source material. Generally, the heat exchanger 65 is exposed to heat radiated from the ingot I for increasing the rate at which the ingot is cooled and thereby increases the axial temperature gradient of the ingot as the ingot is pulled from the source material M. A suitable heat exchanger 65 is described in more detail in U.S. Pat. No. 6,579,362, which is incorporated herein by reference. The heat exchanger 65 (or cooling shield) may optionally form a part of a heat shield assembly 66 (shown in phantom lines) as further described therein. The heat exchanger 65 generally comprises first tube 68a and second tube 68b, which are joined to and extend downward from the inlet fluid connector head 53a and outlet fluid connector head 53b, respectively. A tubing coil 70 connected to respective lower ends of the tubes is shaped for surrounding the growing ingot I.

The fluid flow path FF extends through the inlet fluid connector head 53a, the first tube 68a, the coil 70, the second tube 68b and the outlet fluid connector head 53b. In more detail, and still referring to FIGS. 1–2 and 3A–3B, the fluid flow path FF is defined in part by an inlet port 76a extending through the stud 59a of the inlet fluid connector head 53a of this embodiment, and by a conduit 78a extending from the inlet port to the joint with the first tube 68a. The path FF continues through the respective bores of the first tube 68a, the coil 70 and the second tube 68b. The path continues from the second tube 68b through a conduit 78b of the outlet fluid connector head 53b and through a second or outlet port 76b extending through the stud 59b. Preferably, the fluid connector heads 53a, 53b, tubes 68a, 68b and coil are constructed as a one-piece welded assembly, the fluid flow path therethrough being tested for vacuum and hydrostatic pressure integrity. The cooling fluid has a maximum pressure of, for example, 65 psia.

In operation, cooling fluid flows through the entry fluid passage 50a, the inlet port 76a, the conduit 78a, downward through the first tube 68a, through the coil 70, and then upward through the second tube 68b and the conduit 78b of the outlet fluid connector head 53b. As it flows, particularly when in the coil 70, the fluid removes heat from the ingot I. The fluid continues through the outlet port 76b and then exits through the exit fluid passage 50b of the wall 13. The cooling fluid may be recycled or, depending upon the heat load on the fluid, may be directed to a second crystal puller, or multiple downstream crystal pullers, e.g., for use in respective heat exchangers therein.

Figure 4:
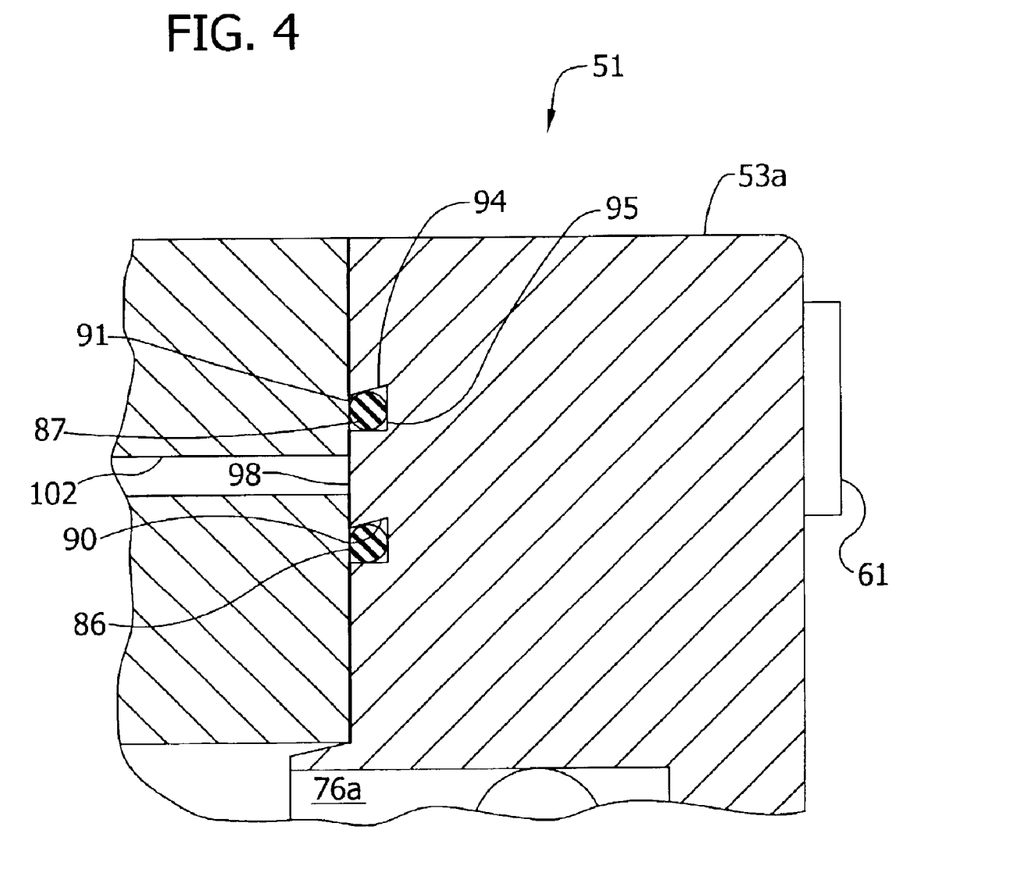
FIG. 4 is an enlarged portion of FIG. 3A.

Referring to FIGS. 2, 3A–3B and 4, each sealing system 51 includes an annular inner seal 86 mounted in an annular inner groove 90 of the respective fluid connector head 53a, 53b. Thus, one inner seal 86 surrounds the inlet port 76a of the inlet fluid connector head 53a (FIG. 3A), and another inner seal surrounds the outlet port 76b of the outlet connector head 53b (FIG. 3B). Each system 51 further includes an annular outer seal 87 mounted in an annular outer groove 91 of each connector head 53a, 53b so as to surround both the inner seal 86 and the respective inlet port 76a or outlet port 76b. The seals 86, 87 engage the mounting portion 57 of the wall 13 so as to seal the fluid within the respective inlet port 76a or outlet port 76b. In this embodiment, the seals 86, 87 are generally coplanar and respective central axes A of the seals are substantially coincident. Note that it is contemplated that the seals 86, 87 may be other than coplanar and co-axial, e.g., if the connector head 53a, 53b engages a portion of the wall 13 that is not planar. In this embodiment, the seals 86, 87 are O-ring seals made of an elastomer such as VITON™, which has good resistance to creep flow or compression set and good temperature resistance up to about 200° C. As best shown in FIG. 4, each groove 90, 91 of this embodiment is channel-shaped having two opposing flanges 94 and a web 95 extending therebetween. One of the flanges 94 of each groove 90, 91 is acutely angled relative to the web 95 to help retain each seal 86, 87 within the groove. Other types of seals, e.g., gaskets, and other types of sealing arrangements are contemplated within the scope of this invention.

An annular space 98 defined between the inner and outer seals 86, 87 is disposed so that any fluid leakage from the inner seal passes through the space. A leak detector is arranged to monitor the space 98 for detecting any fluid leakage. In this embodiment, the leak detector comprises a vent passage 102 extending from the space 98 between the inner and outer seals 86, 87 and through the wall 13 of the housing 12 to an opening 104 on the exterior of the housing such that any fluid leakage in the space will be detectable from outside the housing. In other words, if cooling fluid leaks past the inner seal 86, the fluid will pass through the space 98, the vent passage 102 and the opening 104 so that the fluid is visible from outside the housing. Note that any cooling fluid in the space 98 is prevented from entering the housing 12 by the outer seal 87.

The interior of the housing 12 is typically maintained at a predetermined pressure that is less than atmospheric pressure. In this embodiment, the housing 12 is maintained substantially at a vacuum pressure, e.g., less than about 1 psia, more preferably less than about 0.5 psia, while the atmospheric pressure outside the housing is at about 14 to 15 psia. Due to the fact that the pressure within the housing 12 is less than the pressure outside the housing, atmospheric gas may be drawn through the vent passage 102 past the outer seal 87 if the outer seal leaks.

As can be seen from FIGS. 3A–3B, 4 and the description above, the inner seal 86 substantially prevents leakage of the cooling fluid from adjacent the inlet port 76a and the outlet port 76b of the fluid flow path FF. The outer seal 87 inhibits fluid (e.g., outside ambient air) from being drawn from the vent passage 102 into the housing 12. Additionally, in the event the inner seal 86 leaks and cooling fluid enters the space 98, the outer seal 87 inhibits the low pressure within the housing from causing the cooling fluid to be drawn into the housing. Thus, the outer seal 87 promotes maintenance of the predetermined pressure within the housing 12. In one embodiment, the leak detector also includes a sensor 108 (FIG. 1) disposed in the housing 12 for sensing fluid, such as cooling fluid or gas, which may have leaked past the outer seal 87 into the housing 12. Note that the sensor 108 is shown schematically. The sensor 108 must be made to withstand the extreme temperatures within the housing 12, but the type of sensor and its position in the housing 12 may be other than as illustrated without departing from the scope of the invention. The sensor 108 preferably signals the controller 26 when fluid is sensed so that the controller can stop the crystal growth operation. Alternatively, a leak in the outer seal 87 may be detected by introducing helium into the vent passage 102 and thereafter using an external sensor (not shown) to determine if any helium is drawn through the pump which pulls the vacuum inside the housing 12. In such case, the presence of helium in the housing would indicate that there is a leak in the outer seal 87 and the outer seal should be replaced.

The fluid connector heads 53a, 53b may alternatively be secured to another section of the housing 12, such as an adapter ring (not shown) previously installed in the puller 10 for, among other purposes, introducing inert gas (e.g., argon) into the growth chamber 14. An adapter ring is described in U.S. Pat. No. 6,579,362, and is mounted between the pull chamber 16 and the growth chamber 14 of the housing 12. For purposes of this invention, such an adapter ring is considered a part of the wall 13 of the housing 12. Thus, the fluid connector heads 53a, 53b are connected to the wall 13 of the housing 12 so that the fluid connector heads, the tubes 68a, 68b and the coil 70 depend from the adapter ring.

The fluid sealing system 51 of this invention may be used in other devices of the crystal puller 10. For example, the system 51 may be used at a joint between two vessels or chambers of the crystal puller 10. The system 51 may also be used at a cooling fluid distribution manifold (not shown). The system 51 may also include more than two seals, and more than one space 98. The leak detector may further comprise more than one vent passage 102. The leak detector may comprise an additional fluid sensor (not shown), e.g., an electronic fluid sensor, disposed in the space 98, in the vent passage 102 or on the outside of the housing 12 to detect the fluid. This additional sensor may be connected to the controller 26 such that the sensor signals the controller when liquid is detected. The additional sensor may also be adapted to sense gas flowing through the space 98, such as ambient air being drawn through the vent passage 102 and into the housing 12 due to a leak through the outer seal 87.

The heat exchanger 65 may vary from the configuration described herein, and virtually any type of heat exchanger may be used within the scope of this invention. Also, the cooling fluid may be any suitable liquid or gas within the scope of this invention.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A fluid sealing system for use in a crystal puller for growing a monocrystalline ingot from molten semiconductor source material, the crystal puller having a housing enclosing a crystal growth chamber, a crucible contained in the growth chamber for holding the molten semiconductor source material, a heater in thermal communication with the crucible for heating the crucible, a pulling mechanism positioned above the crucible for pulling the ingot from the molten source material held by the crucible, a fluid flow path contained in the housing, and a fluid passage through a wall of the housing for passage of fluid between outside the housing and the fluid flow path, the fluid sealing system comprising:

a fluid connector head adapted for connection to the fluid passage and to the fluid flow path to establish fluid communication between the fluid flow path and the outside of the housing, the head having a port adapted for fluid communication with the fluid passage through the wall of the housing, a first seal around the port and adapted for sealing engagement with the head, a second seal around the port and adapted for sealing engagement with the head, a space defined generally between the first and second seals, and a leak detector arranged to monitor the space for detecting fluid leakage past at least one of the first and second seals.

2. A fluid sealing system as set forth in claim 1 wherein the space is disposed such that any fluid leakage from the first or second seals passes through the space, and wherein the leak detector extends from the space.

3. A fluid sealing system as set forth in claim 2 wherein the leak detector includes a vent passage extending from the space between the seals through the housing wall such that any fluid leakage from at least one of the first and second seals is detectable from outside the housing.

4. A fluid sealing system as set forth in claim 3 wherein the fluid flow path is adapted for receiving a liquid, and wherein liquid leaking past the first seal passes through the space and through the vent passage to an opening disposed such that the liquid is visible from outside the housing.

5. A fluid sealing system as set forth in claim 1 wherein the housing is adapted to be maintained at a predetermined pressure and wherein the second seal is arranged relative to the port and the first seal to promote maintenance of the predetermined pressure within the housing when the fluid connector head is connected to the fluid passage.

6. A fluid sealing system as set forth in claim 5 wherein the predetermined pressure is less than atmospheric pressure, and wherein the leak detector includes a sensor within the housing for sensing fluid leakage drawn into the housing past the second seal.

7. A fluid sealing system as set forth in claim 1 wherein a central axis of the first seal is substantially coincident with a central axis of the second seal.

8. A fluid sealing system as set forth in claim 7 wherein the first and second seals are substantially coplanar.

9. A fluid sealing system as set forth in claim 8 wherein the first and second seals are O-ring seals.

10. A fluid sealing system as set forth in claim 1 in combination with the fluid flow path, and wherein the fluid flow path extends through a heat exchanger.

11. A fluid sealing system as set forth in claim 10 further comprising a second fluid connector head having a second port adapted for fluid communication with the fluid flow path and a second fluid passage through the wall of the housing, first and second seals around the port and adapted for sealing engagement with the head, a space defined between the first and second seals, and a leak detector arranged to monitor the space for detecting fluid leakage past at least one of the first and second seals.

12. A fluid sealing system as set forth in claim 1 wherein the seals are held by the fluid connector head.

13. A crystal puller for growing a monocrystalline ingot from molten semiconductor source material, the crystal puller comprising:

a housing enclosing a crystal growth chamber and having a wall;

a crucible supported in the chamber for containing the molten semiconductor source material;

a heater in thermal communication with the crucible for heating the crucible to a temperature sufficient to melt the semiconductor source material held by the crucible;

a pulling mechanism positioned above the crucible for pulling the ingot from the molten source material held by the crucible;

a heat exchanger disposed above the molten source material and interposed between the ingot and the crucible as the ingot is pulled from the molten source material, the heat exchanger being exposed to heat radiated from the ingot for increasing the rate at which the ingot is cooled and thereby increasing an axial temperature gradient of the ingot as the ingot is pulled from the molten source material, the heat exchanger including a fluid flow path;

a fluid passage through the wall of the housing for passage of fluid between outside the housing and the fluid flow path;

a sealing system for inhibiting fluid leakage from the fluid flow path and for inhibiting fluid leakage into the housing, the sealing system including a fluid connector head adapted for connection to the fluid passage and to the fluid flow path to establish fluid communication between the fluid flow path and the outside of the housing, the head having a port adapted for fluid communication with the fluid passage through the wall of the housing, a first seal around the port and adapted for sealing engagement with the head, a second seal around the port and adapted for sealing engagement with the head, a space being defined generally between the first and second seals, and a leak detector arranged to monitor the space for detecting fluid leakage past at least one of the first and second seals.

14. A crystal puller as set forth in claim 13 wherein the space is disposed such that any fluid leakage from the first and second seals passes through the space, and wherein the leak detector extends from the space.

15. A crystal puller as set forth in claim 14 wherein the leak detector includes a vent passage extending from the space between the seals through the housing wall such that any fluid leakage from at least one of the first and second seals is detectable from outside the housing.

16. A crystal puller as set forth in claim 15 wherein the cooling fluid is a liquid, and wherein liquid leaking past the first seal passes through the space and through the vent passage to an opening disposed such that the liquid is visible from outside the housing.

17. A crystal puller as set forth in claim 13 wherein the housing is adapted to be maintained at a predetermined pressure and wherein the second seal is arranged relative to the port and the first seal to promote maintenance of the predetermined pressure within the housing when the fluid connector head is connected to the fluid passage.

18. A crystal puller as set forth in claim 17 wherein the predetermined pressure is less than atmospheric pressure, and wherein the leak detector includes a sensor within the housing for sensing fluid leakage drawn into the housing past the second seal.

19. A crystal puller as set forth in claim 13 wherein a central axis of the first seal is substantially coincident with a central axis of the second seal.

20. A crystal puller as set forth in claim 19 wherein the first and second seals are substantially coplanar.

21. A crystal puller as set forth in claim 20 wherein the first and second seals are O-ring seals.

22. A crystal puller as set forth in claim 13 further comprising a second fluid connector head having a second port adapted for fluid communication with the fluid flow path and a second fluid passage in the wall of the housing, first and second seals around the port and adapted for sealing engagement with the head, a space defined between the first and second seals, and a leak detector adapted to sense fluid leakage past at least one of the first and second seals.

23. A crystal puller as set forth in claim 22 wherein the first and second fluid connector heads are secured to the housing such that respective first and second seals sealingly engage the housing.

* * * * *

UNITED STATES PATENT AND TRADEMARK OFFICE
CERTIFICATE OF CORRECTION

| | | |
|---|---|---|
| PATENT NO. | : 6,942,733 B2 | Page 1 of 1 |
| APPLICATION NO. | : 10/465528 | |
| DATED | : September 13, 2005 | |
| INVENTOR(S) | : Carl F. Cherko and Robert D. Cook | |

It is certified that error appears in the above-identified patent and that said Letters Patent is hereby corrected as shown below:

<u>Title Page</u>
(73) Assignee: "MEMC Electronics Materials, Inc." should read -- MEMC Electronic Materials, Inc. --.

Signed and Sealed this

Tenth Day of October, 2006

JON W. DUDAS
*Director of the United States Patent and Trademark Office*